(12) United States Patent
Kim

(10) Patent No.: US 6,448,651 B1
(45) Date of Patent: Sep. 10, 2002

(54) SEMICONDUCTOR DEVICE HAVING A MULTI-LEVEL METALLIZATION AND ITS FABRICATING METHOD

(75) Inventor: Sung-Bong Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/396,147

(22) Filed: Sep. 15, 1999

(30) Foreign Application Priority Data

Sep. 16, 1998 (KR) .............................. 98-38308

(51) Int. Cl.[7] ..................... H01L 29/40; H01L 29/00; H01L 21/4763; H01L 21/469
(52) U.S. Cl. .................. 257/758; 257/759; 257/760; 257/503; 257/508; 257/763; 257/764; 257/775; 438/624; 438/625; 438/774; 438/622; 438/637
(58) Field of Search ................ 257/758–760, 257/503, 508, 763, 764, 774, 775; 438/624, 625, 774, 622, 637

(56) References Cited

U.S. PATENT DOCUMENTS

| 5,666,007 A | * | 9/1997 | Chung .................... 257/751 |
| 5,710,462 A | * | 1/1998 | Mizushima ............. 257/758 |
| 5,882,963 A | * | 3/1999 | Kerber .................... 438/195 |
| 6,133,139 A | * | 10/2000 | Dalal et al. ............. 438/624 |
| 6,165,899 A | * | 12/2000 | Matumoto ............... 438/638 |
| 6,181,012 B1 | * | 1/2001 | Edelstein et al. ........ 257/762 |
| 6,184,130 B1 | * | 2/2001 | Ku et al. .................. 438/655 |
| 6,278,187 B1 | * | 8/2001 | Takata et al. ............ 257/758 |

FOREIGN PATENT DOCUMENTS

JP 41014800 * 6/1998

* cited by examiner

Primary Examiner—David E. Graybill
Assistant Examiner—James Mitchell
(74) Attorney, Agent, or Firm—Marger Johnson & McCollom, P.C.

(57) ABSTRACT

Provided is a semiconductor device having a multi-level metallization. The device includes a semiconductor substrate having an active area, a first insulating layer deposited on the substrate, and first and second contact holes penetrating the first insulating layer exposing a predetermined surface of the active area. First and second conductive plugs are formed in the first and second contact holes, respectively. First and second conductive patterns are spaced a predetermined distance on both sides of the second conductive plug. The first conductive pattern is connected to the first conductive plug. An etching prevention layer and a second insulating layer are sequentially formed on the resultant structure. A third contact hole penetrates the second insulating layer and the etching prevention layer exposes a predetermined surface of the first conductive pattern. A fourth contact hole penetrates the second insulating layer and the etching prevention layer to expose the surface of the second conductive plug. Third and fourth conductive plugs are formed in the third and fourth contact holes, respectively. Third and fourth conductive patterns are individually formed on a predetermined area of the second insulating layer to be connected with the third and fourth conductive plugs, respectively.

24 Claims, 8 Drawing Sheets

US 6,448,651 B1

SEMICONDUCTOR DEVICE HAVING A MULTI-LEVEL METALLIZATION AND ITS FABRICATING METHOD

BACKGROUND OF THE INVENTION

1. Field of the Invention

The present invention relates to a semiconductor device and, more particularly, to a semiconductor device having a multi-level metallization without a contact pad that allows large scale integration and a fabricating method thereof.

2. Discussion of Related Art

In the era of deep sub-micron, the integration rate of semiconductor devices grows higher in inverse proportion to their size. As the size of a conductive plug for connecting between devices and the space and width between metallization layers also become smaller, it is necessary to apply a multi-level metallization, W-plug, Al-reflow, and chemical mechanical polishing (CMP) processes to all semiconductor fabrications.

FIGS. 1a to 1e illustrates the process of fabricating a conventional semiconductor device having a multi-level metallization. As shown in FIG. 1a, a field oxide layer 12 is first formed on a device isolation region on a semiconductor substrate 10. The field oxide layer 12 defines an active area for an active device. Impurities are implanted into the substrate 10. The impurities diffuse forming an active area 14 in the substrate 10. A first insulating layer 16 is formed on the substrate 10 including the field oxide layer 12 and selectively etched to thereby expose a predetermined surface of the active area 14. The first and second contact hole h1 and h2, respectively, are formed on the etched part of the active area 14.

Referring to FIG. 1b, a conductive layer 18 on the first insulating layer 16 is formed.

Referring to FIG. 1c, the conductive layer 18 is subjected to a CMP or etch-back process until the surface of the first insulating layer 16 is exposed. The first and second conductive plugs 18a and 18b are formed in the first and second contact holes h1 and h2, respectively. A conductive layer is formed on the first insulating layer 16 including the conductive plugs 18a and 18b. The conductive layer is selectively etched to expose a predetermined surface of the first insulating layer 16 such that a first conductive layer pattern 20 connected to the first conductive plug 18a, a contact pad 22 connected to the second conductive plug 18b, and a second conductive layer pattern 24 are formed simultaneously. At this time, the first conductive pattern 20 connects the two upper/lower conductive plugs as well as serving as an electric metallization layer. The contact pad 22 connects the two upper/lower conductive plugs. The second conductive pattern 24 serves as an electric metallization wire.

The first conductive pattern 20, contact pad 22, and second conductive pattern 24 are spaced at a distance E preventing a short from developing between the patterns 20 and 24 and the pad 22. The spacer E is generally greater than about 0.4 μm. The length of the spacer E depends on the resolution of the exposure equipment and the etching ability of the conductive layer consisting of the first and second conductive patterns 20 and 24 and contact pad 22.

Referring to FIG. 1d, a second insulating layer 26 is formed on the first insulating layer 16 and the first and second conductive layers 20 and 24 and contact pad 22. The second insulating layer 26 is selectively etched thereby exposing a predetermined surface of the first conductive layer 20 and contact pad 22. A third and fourth contact holes h3 and h4, respectively, are formed in the insulating layer 26.

The contact pad 22 is normally formed to be wider than the fourth contact hole h4. This is because light exposure during the photolithography process that forms the fourth contact hole h4 misaligns the fourth contact hole h4 to the contact pad 22. Thus, an inferior contact can occur between the contact pad 22 and the subsequently formed fourth conductive plug. To prevent this type of interior contact from forming, the contact pad 22 is currently fabricated with an overlap margin labeled as C in FIG. 1d.

Referring to FIG. 1e, the third and fourth conductive plugs 28a and 28b are formed in the third and fourth contact holes h3 and h4, respectively, using the same method as described for forming the first and second contact holes h1 and h2, respectively. A third conductive pattern 30 connected to the third conductive plug 28a and the fourth conductive pattern 32 connected to the fourth conductive plug 28b are formed simultaneously by selectively etching a conductive layer deposited on the surface of the second insulating layer. The third and fourth conductive pattern, 30 and 32, respectively, serve as an electric metallization wire.

To summarize, the first insulating layer is formed on the semiconductor substrate 10 having the active area 14. The first and second contact holes h1 and h2 are formed on and passing through the first insulating layer 16 thereby exposing a predetermined surface of the active area 14. The first and second conductive plugs 18a and 18b are formed in the first and second contact holes h1 and h2, respectively. The contact pad 22 is connected to the second conductive plug 18b and interposed between the first conductive pattern 20, and the second conductive pattern 24. Each of the first and second conductive patterns 20 and 24, respectively, are spaced predetermined distance apart. The second insulating layer 26 is formed on the first insulating layer 16. The third and fourth contact holes h3 and h4 are formed passing through the second insulating layer 26 to thereby expose a predetermined surface of the first conductive pattern 20 and contact pad 22. The third and fourth conductive plugs 28a and 28b are formed in the third and fourth contact holes h3 and h4, respectively. The third conductive pattern 30 is connected to the third conductive plug 28a and the fourth conductive pattern 32 is connected to the fourth conductive plug 28b. The third and fourth conductive patterns 30 and 32 are spaced a predetermined distance apart.

Assuming that the horizontal width of the fourth conductive plug 28b is A, and the spacer between the first and second conductive patterns 20 and 24 and contact pad 22 is E, the horizontal and vertical width of the contact pad is A+(2*C) and the fourth contact hole h4 maintains a space greater than (C+E) to the first conductive pattern 20. In addition, the horizontal length between the first and second conductive patterns 20 and 24 on the same line is A+(2*C)+(2*E).

FIG. 2 is a top view of the layout structure of the conventional semiconductor device shown in FIG. 1e. Only the layout structure under the third and fourth conductive patterns 30 and 32, respectively, directly associated with the invention is shown in FIG. 2.

Referring to FIG. 2, the first conductive pattern 20, contact pad 22, and second conductive pattern 24 are spaced at a predetermined distance on the same line, having the contact pad 22 interposed. The second and fourth conductive plugs 18b and 28b are laid on/under the contact pad 22, and are connected to each other.

The following problems may occur when a semiconductor device is manufactured using the process described above. When forming the contact pad 22 to electrically connect the second conductive plug 18b and the fourth conductive plug 28b, the size of the contact pad 22 is structured to include the overlap margin C to prevent misalignment. The size of the overlap margin makes it impossible to reduce the width of the contact pad 22 not to exceed A+(2*C). The horizontal distance between the first and second conductive patterns 20 and 24 is actually larger than A+(2*C)+(2*E).

Limiting reduction of the pattern size in the horizontal direction in the semiconductor device makes large-scale integration of the device difficult if not impossible. Therefore, more effort is necessary to solve this problem. Accordingly, a need remains for an improved semiconductor device with a multi-level metallization.

SUMMARY OF THE INVENTION

An object of the present invention is to overcome the problems associated with prior art semiconductor devices.

Another object of the present invention is to provide a semiconductor device having a multi-level metallization capable of reducing the pattern size in a horizontal direction of the semiconductor device. The pattern size is reduced by changing the layout to have a structure where a second lower conductive plug and a fourth upper conductive plug are connected directly without a contact pad allowing large scale integration of the semiconductor device.

Yet another object of the present invention is to provide a method of effectively fabricating a semiconductor device having a multi-level metallization.

To achieve these and other objects of the present invention, a first embodiment semiconductor device having a multi-level metallization is provided. The semiconductor device includes a semiconductor substrate having an active area; a first insulating layer deposited on the substrate; first and second contact holes formed penetrating the first insulating layer exposing a predetermined surface of the active area; first and second conductive plugs respectively formed on the first and second contact holes; first and second conductive patterns spaced a predetermined distance apart on either side of the second conductive plug, the first conductive pattern being connected to the first conductive plug; an etching prevention layer and a second insulating layer sequentially formed on the first and second conductive patterns and the first insulating layer; a third contact hole formed penetrating the second insulating layer and the etching prevention layer exposing a predetermined surface of the first conductive pattern; a fourth contact hole formed penetrating the second insulating layer and the etching prevention layer exposing the second conductive plug; third and fourth conductive plugs respectively formed on the third and fourth contact holes; and third and fourth conductive patterns formed on predetermined surfaces of the second insulating layer, the third and fourth conductive patterns being respectively connected to the third and fourth conductive plugs.

A second embodiment of the semiconductor memory device of the present invention is also provided. The second embodiment of the semiconductor memory device includes a semiconductor substrate having an active area; a first insulating layer, an etching prevention layer, and a second insulating layer sequentially formed on the substrate; first and second contact holes formed penetrating the second insulating layer, the etching prevention layer, and the first insulating layer exposing a predetermined surface of the active area; first and second conductive plugs respectively formed in the first and second contact holes; first and second conductive pattern spaced a predetermined distance apart on either side of the second conductive plug, the first and second conductive patterns being formed on the second insulating layer and the first conductive pattern being connected to the first conductive plug; a third insulating layer formed on the first and second patterns and the second insulating layer; a third contact hole formed penetrating the third insulating layer exposing a predetermined surface of the first conductive pattern; a fourth contact hole formed penetrating the third insulating layer and the second insulating layer exposing the second conductive plug and a predetermined adjacent surface of the etching prevention layer; third and fourth conductive plugs respectively formed on the third and fourth contact holes; and third and fourth conductive patterns formed on predetermined surfaces of the second insulating layer, the third and fourth conductive patterns being respectively connected to the third and fourth conductive plugs.

A method of fabricating the first embodiment semiconductor memory device is also provided. The method comprises forming a first insulating layer on a semiconductor substrate having an active area; forming first and second contact holes by selectively etching the first insulating layer; forming first and second conductive plugs in the first and second contact holes, respectively; forming a conductive layer on the first insulating layer and the first and second conductive plugs; forming first and second conductive patterns on both sides of the second conductive plug by selectively etching the conductive layer thereby exposing the second conductive plug and a predetermined surface of the first insulating layer, the first conductive pattern being connected to the first conductive plug; sequentially forming an etching prevention layer and a second insulating layer on the first insulating layer, the first and second conductive patterns, and the second conductive plug; forming a third and fourth contact holes by selectively etching the second insulating layer and the etching prevention layer thereby exposing a predetermined surface of the first conductive pattern and the surface of the second conductive plug; forming third and fourth conductive plugs in the third and fourth contact holes, respectively; and forming a third and a fourth conductive patterns by forming a conductive layer on the second insulating later and the third and fourth plugs and selectively etching the conductive layer, the third conductive pattern being connected to the third conductive plug and the fourth conductive pattern being connected to the fourth conductive plug.

A method of fabricating the second embodiment semiconductor memory device is also provided. The method comprises sequentially forming a first insulating layer, an etching prevention layer, and a second insulating layer on a semiconductor substrate having an active area; forming a first and second contact holes by selectively etching the second insulating layer, the etching prevention layer, and first insulating layer; forming first and second conductive plugs in the first and second contact holes, respectively; forming a first conductive layer on the second insulating layer and the first and second conductive plugs; forming first and second conductive patterns on both sides of the second conductive plug by selectively etching the first conductive layer thereby exposing the second conductive plug and a predetermined surface of the second insulating layer, the first conductive pattern being connected to the first conductive plug; forming a third insulating layer on the second insulating layer, the first and second conductive patterns, and the second conductive plug; forming third and fourth contact holes by selectively etching the second and third insulating layers thereby exposing a predetermined surface of the first conductive pattern and a predetermined surface of the etching prevention layer adjacent to the second conductive plug; forming third and fourth conductive plugs in the third and fourth contact holes, respectively; forming a second conductive layer on the third insulating layer and the third and fourth conductive plugs; and forming third and fourth conductive patterns by selectively etching the second conductive layer, the third conductive pattern being connected to the third conductive plug and the fourth conductive pattern being connected to the fourth conductive plug.

If the semiconductor device having a multi-level metallization of the invention is fabricated to have the above-mentioned structure, the second conductive plug and the fourth conductive plug are connected directly to each other without a contact pad thereby reducing the horizontal length between the first and second conductive patterns.

BRIEF DESCRIPTION OF THE ATTACHED DRAWINGS

The foregoing and other objects, features, and advantages of the invention will become more readily apparent from the following detailed description of a preferred embodiment that proceeds with reference to the following drawings.

DETAILED DESCRIPTION OF PREFERRED EMBODIMENT

Reference will now be made in detail to the preferred embodiments of the present invention, examples of which are illustrated in the accompanying drawings.

The invention is contrived to improve the process of fabricating a semiconductor device having a multi-level metallization in such a manner that the second conductive plug and the fourth conductive plug are directly connected to each other without a contact pad thereby reducing the horizontal length between the first and second conductive patterns. This improvement process allows large-scale integration of the semiconductor device.

Figure 3A:
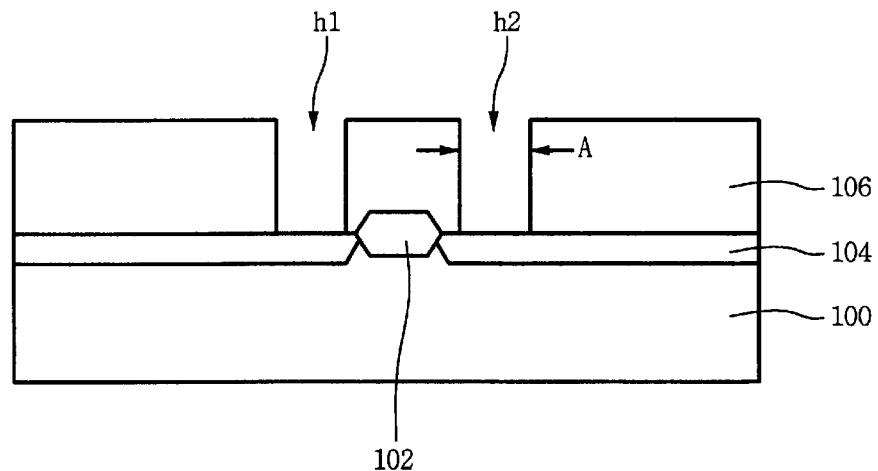
FIGS. 3a to 3d illustrate a method for fabricating a semiconductor device having a multi-level metallization according to a first embodiment of the present invention.
Figure 3B:
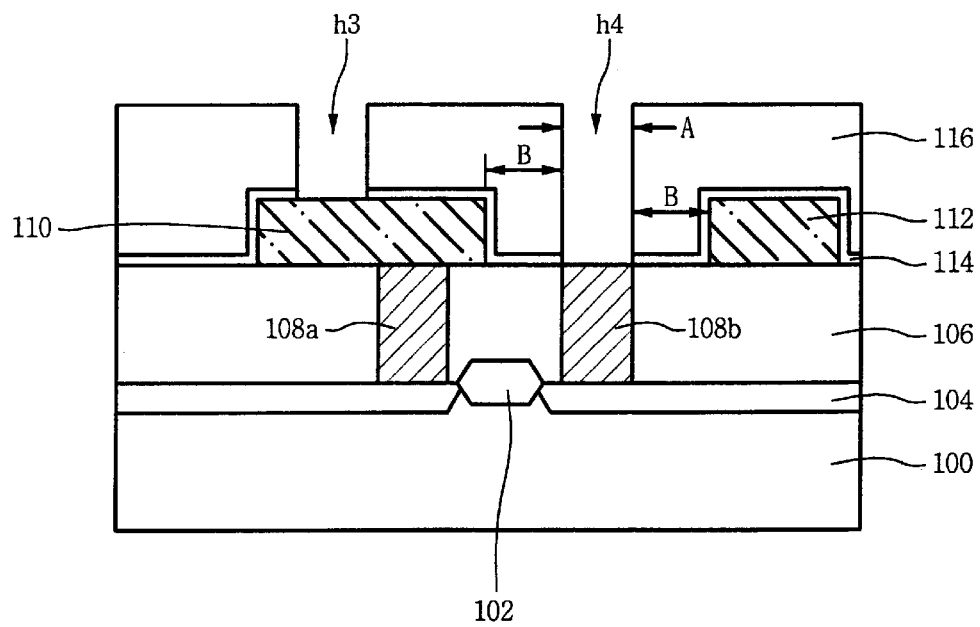
Figure 3C:
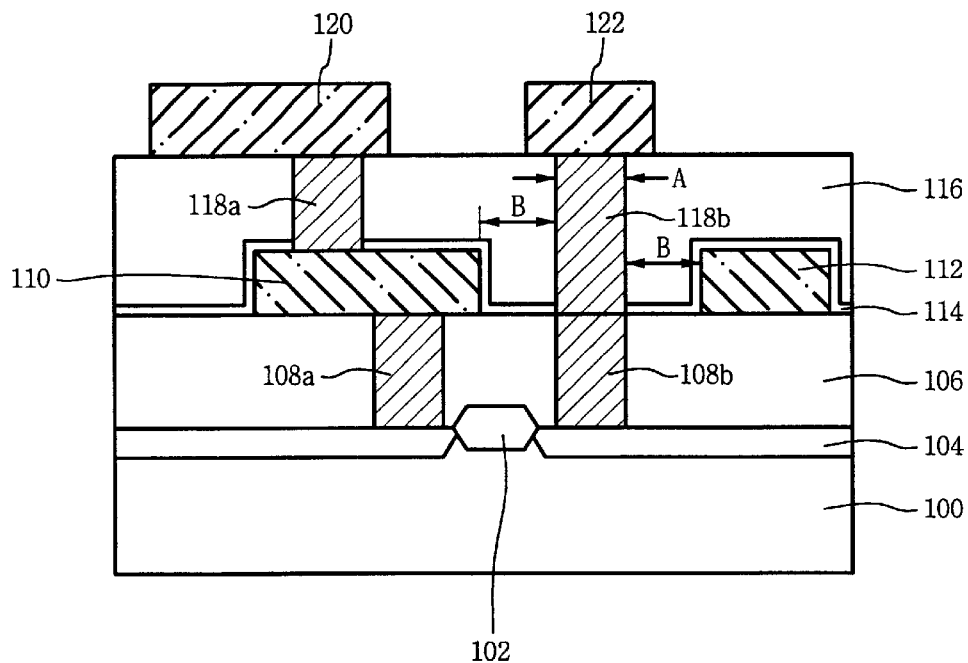
Figure 4:
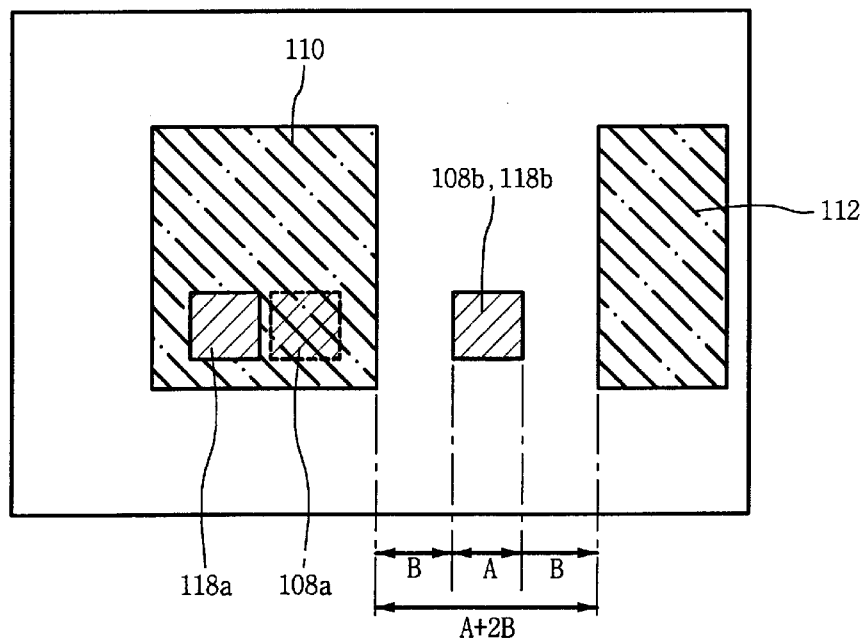
FIG. 4 is a top view showing a layout of the semiconductor device shown in FIG. 3c.

The invention will be described with reference to FIGS. 3a to 3c, 4, 5a to 5c, and 6. FIGS. 3a to 3c illustrate a method for fabricating a semiconductor device having a multi-level metallization according to a first embodiment of the invention. FIG. 4 is a top view showing a layout of the semiconductor device shown in FIG. 3c.

Referring to FIG. 3a, a field oxide layer 102 is formed on a device isolation region on a semiconductor substrate 100. The field oxide layer 102 defines an active area 104 formed by implanting impurities that diffuse into the substrate 100. A first insulating layer 106 is formed on the active area 104 and the field oxide layer 102. The first insulating layer 106 is selectively etched exposing a predetermined portion of the active area 104 on the substrate 100. The first and second contact hole h1 and h2, respectively, are formed on the exposed predetermined surface of the active area 104. The second contact hole h2 has a width denoted by A.

Referring to FIG. 3b, a conductive layer is formed on the first insulating layer 106 including the first and second contact holes h1 and h2, respectively. The conductive layer is subjected to a CMP or etch-back process until the surface of the first insulating layer 106 is exposed. The first and second conductive plugs 108a and 108b are formed in the first and second contact holes h1 and h2, respectively. A conductive layer is formed on the first insulating layer 106 including the conductive plugs 108a and 108b. The conductive layer is selectively etched to expose the surface of the second conductive plug 108b and a predetermined surface of the first insulating layer 106 so that a first conductive layer pattern 110 connected to the first conductive plug 108a, and a second conductive pattern 112 are formed simultaneously. The first and second conductive plugs 108a and 108b are made of polysilicon, polycide, or a multi-level layer composed of a metal barrier layer of Ti/TIN and W material, e.g., the multi-level layer material having a Ti/TiN/W material. The first and second conductive pattern 110 and 112, respectively, are made of an Al alloy, a Cu alloy, polysilicon, polycide, or a Ti, TiN and Al alloy, e.g., multi-level layer material of Ti/TiN/Al material or Al/TiN material. The first conductive pattern 110 serves as a medium between the two upper/lower plugs and an electrical metallization and the second conductive pattern 112 serves as an electric metallization.

The first and second conductive patterns 110 and 112, respectively, are spaced from the second conductive plug 108b at a distance denoted by B. The distance B prevents a short from developing between the conductive patterns 110 and 112, respectively, and the second conductive plug 108b.

An etching-prevention layer 114 and a second insulating layer 116 are successively formed on the exposed surface of the second conductive plug 108b and the first insulating layer 106 including the first and second conductive patterns 110 and 112, respectively. The insulating layer 116 and the etching prevention layer 114 are selectively etched to expose a predetermined surface of the first conductive pattern 110 and the surface of the second conductive plug 108b thereby forming third and fourth contact holes h3 and h4. The fourth contact hole h4 has a width denoted by A.

Figure 1A:
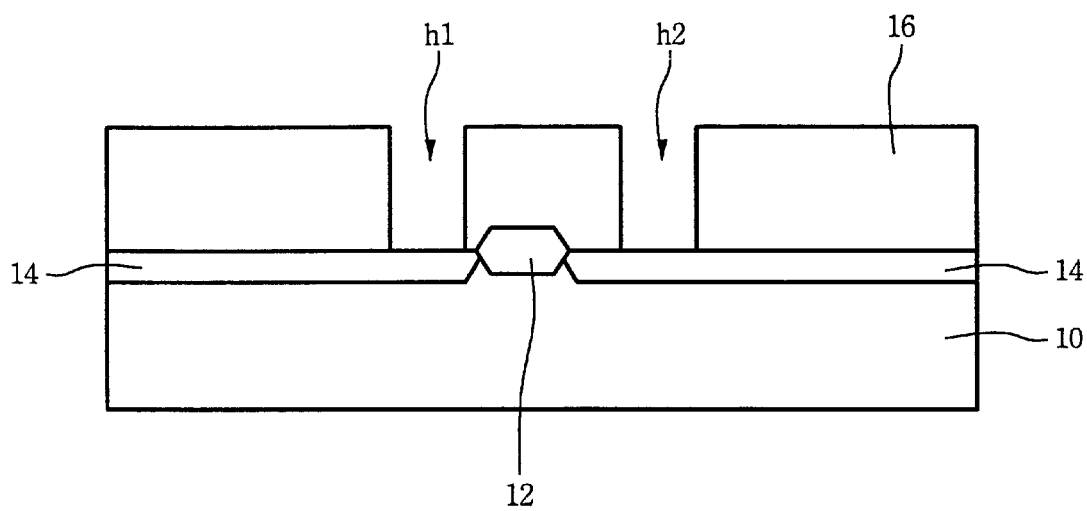
FIGS. 1a to 1e illustrate a method for fabricating a conventional semiconductor device having a multi-level metallization.
Figure 1B:
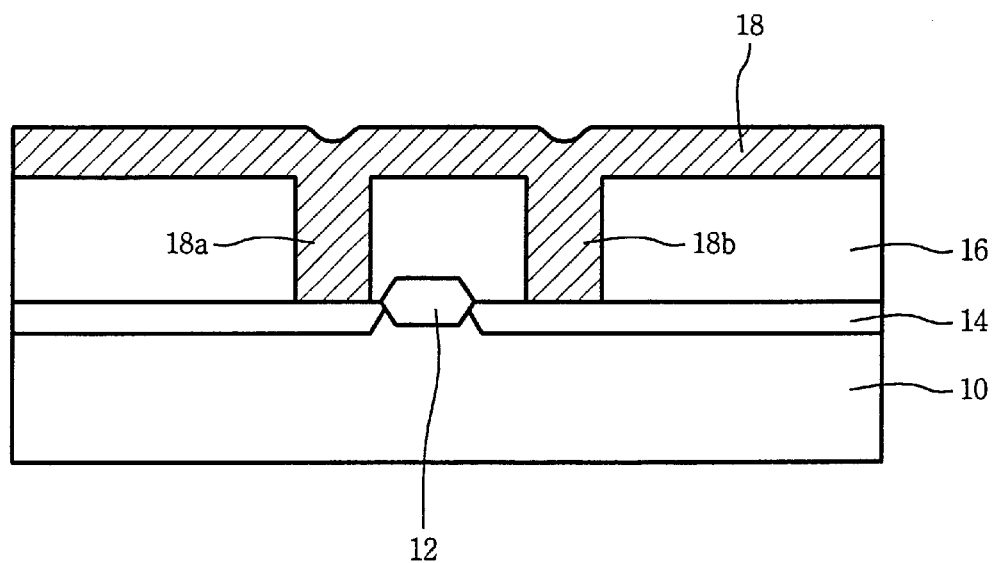
Figure 1C:
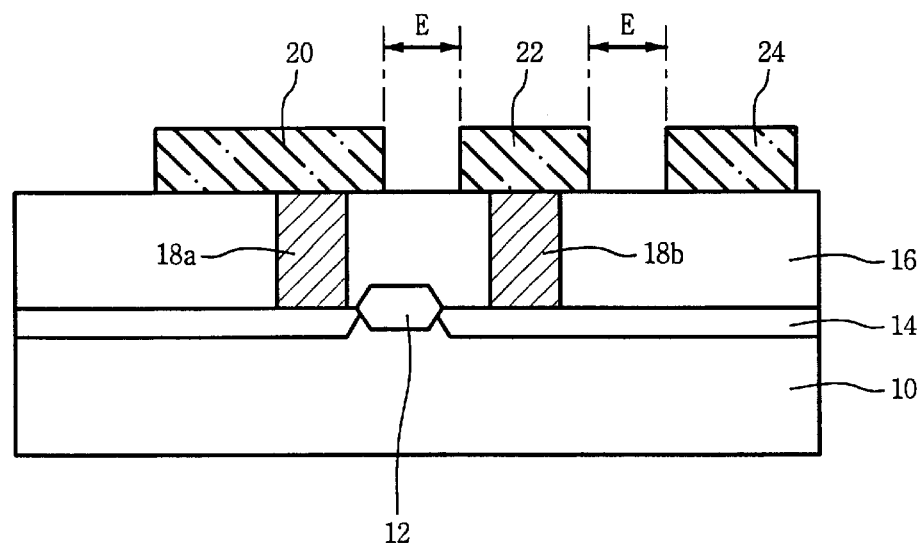
Figure 1D:
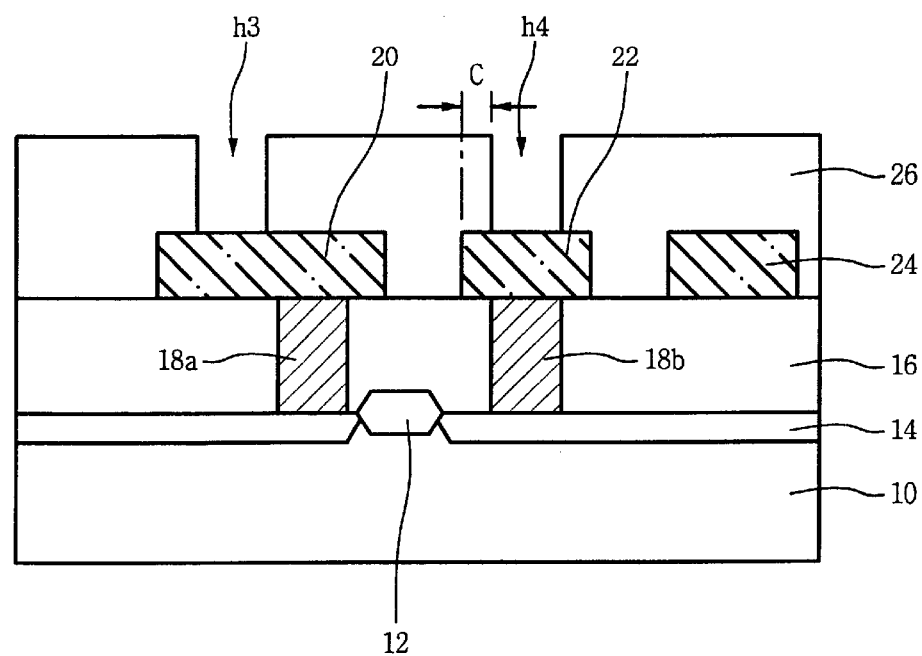
Figure 1E:
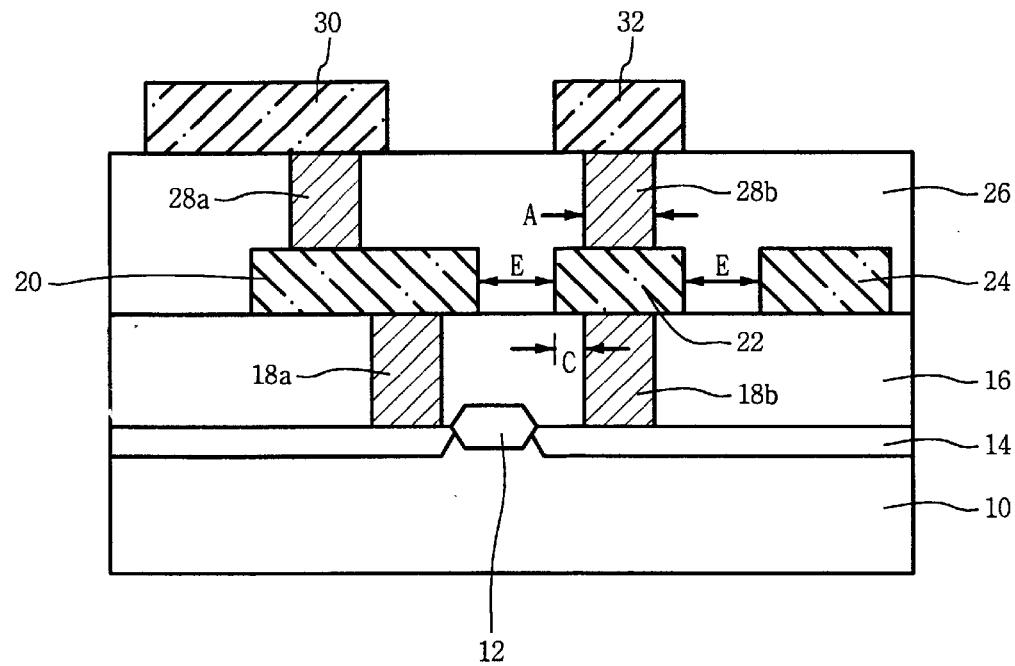
Figure 2:
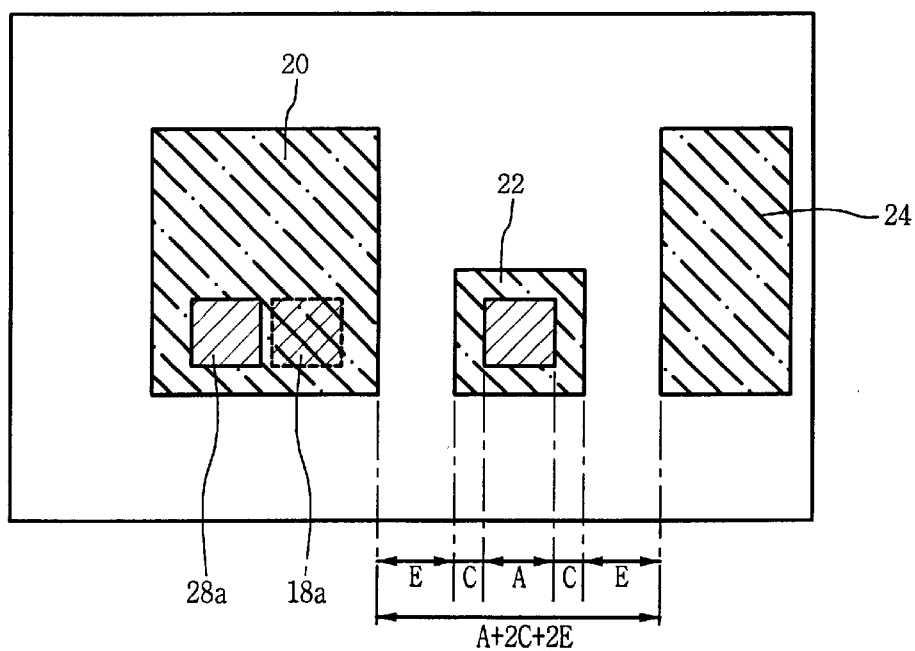
FIG. 2 is a top view showing a layout of the semiconductor device shown in FIG. 1e.

The fourth contact hole h4 may be narrower or wider than the second contact hole h2. If the width of the fourth contact hole h4 is wider than that of the second contact hole h2, the extended width should be smaller than the overlap margin C of the contact pad 22 in FIG. 2 resulting in a small width extension.

The etching prevention layer 114 is formed to prevent an inferiority resulting from an over-etching. In other words, there is a difference in etching depth between the third and fourth contact hole h3 and h4. If the etching process for the second insulating layer 116 is performed without the etching prevention layer 114, the surface of the first conductive pattern 110 in the third contact hole h3 formation area, which should be etched relatively less than the fourth contact hole h4, can be over-etched. For this reason, the etching prevention layer 114 should be made of a material whose etch-selection rate is high relative to the material forming the first and second insulating layers 106 and 116, as follows. For example, if the first and second insulating layers 106 and 116 are in the group of oxide layer ($SiO_2$), the etching prevention layer 114 should be made of a nitride layer ($Si_3N_4$) or a nitride-oxide layer (SiON) such that the etch-selection ratio of the insulating layers 106 and 116 to the etching prevention layer 114 is 10:1.

Figure 3D:
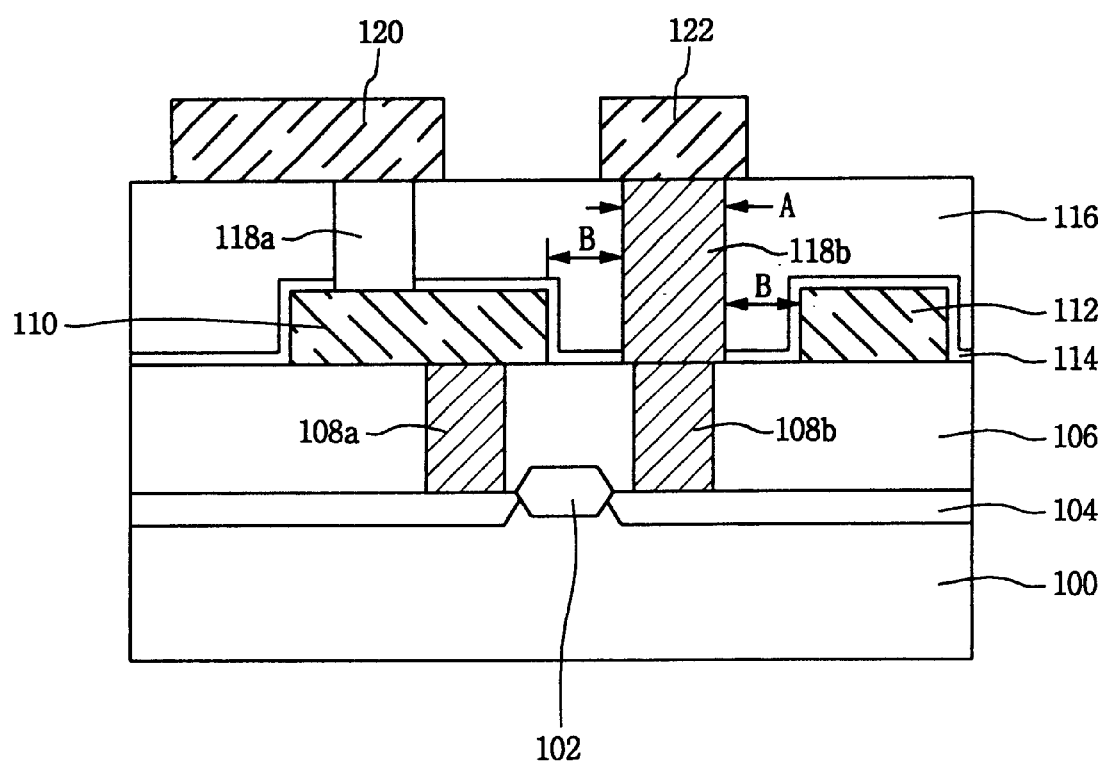

Referring to FIG. 3c and 3d, third and fourth conductive plugs 118a and 118b, respectively, respectively, are formed in the third and fourth contact holes h3 and h4, respectively. A conductive layer is formed on the substrate. A predetermined portion of the conductive layer is selectively etched such that the third conductive pattern 120 connected to the third conductive plug 118a and the fourth conductive pattern 112 connected to the fourth conductive plug 118b are formed simultaneously.

As before, the third and fourth conductive plugs 118a and 118b, respectively, are formed of polysilicon, polycide, or a multi-level layer material composed of a metal barrier layer of Ti/TiN and W (for example, multi-level layer of Ti/TiN/W material). The third and fourth conductive patterns 120 and 122, respectively, are made of an Al alloy, Cu alloy, polysilicon, polycide, or a multi-level layer composed of Ti, TiN and Al alloy (for example, multi-level layer of Ti/TiN/Al or Al/TiN).

Consequently, as shown in FIG. 3c, the first insulating layer 106 is formed on the semiconductor substrate 100 including the active area 104, the first and second contact holes h1 and h2 are formed. In the insulating layer 106 passing through the first insulating layer thereby exposing a predetermined part of the active area 104. In the first and second contact holes h1 and h2, respectively, are formed the first and second conductive plugs 108a and 108b, respectively. On the first insulating layer 106, the exposed second conductive plug 108b is interposed between the first conductive plug 108a connected to the first upper conductive plug and the second conductive pattern 112, both spaced at a predetermined distance. The etching prevention layer 114 and the second insulating layer 116 are successively formed on the overall surface of the resultant structure. The third contact hole h3 passes through the second insulating layer 116 and the etching prevention layer 114 to expose a predetermined portion of the first conductive pattern 110. The fourth contact hole h4 passes through the second insulating layer 116 and the etching prevention layer 114 to expose a predetermined portion of the second conductive plug 108b. The third and fourth conductive plugs 118a and 118b are formed. The third conductive pattern 120 connected to the third conductive plug 118a and the fourth conductive pattern 122 connected to the fourth conductive plug 118b are formed on the second insulating layer 116. The third and fourth conductive patterns 120 and 122, respectively, are spaced a predetermined distance apart.

The width of the fourth conductive plug 118b may be smaller or larger than the width A of the second conductive plug 108b, thus connecting between the upper and lower layers. Assuming the horizontal width of the fourth conductive plug 118b is the same as width A of the second conductive plug 108b and the spacer between the first conductive pattern 110, the fourth conductive plug 118b, and the second conductive pattern 112 is B, the length in a horizontal direction between the first and second conductive pattern 110 and 112 is given by A+(2*B).

FIG. 4 is a top view showing the layout of the semiconductor device according to the first embodiment of the present invention. For convenience, only the layout of the lower third and fourth conductive patterns 120 and 122, respectively, is shown in the drawing.

With reference to FIG. 4, we can see that the first and second conductive patterns 110 and 112 are spaced at a predetermined distance B, putting the second and fourth conductive plugs 108b and 118b, respectively, directly connected to each other without a contact pad therebetween and, thus, interposed between the conductive patterns 110 and 112. If the semiconductor device is fabricated with the above-mentioned structure, the spacer B is less than 0.2 μm. The spacer B considers the spacer margin which, when forming the fourth contact hole h4, is given to increase process stability caused by misalignment of the exposure equipment and the etching ability of the conductive layer. The misalignment of the exposure equipment is generally within 0.1 μm. Therefore, contrary to the conventional semiconductor device manufactured with a spacer E is 4 μm or more, the horizontal length between the first .and second conductive patterns 110 and 112 is considerably reduced, allowing large-scale integration.

Figure 5A:
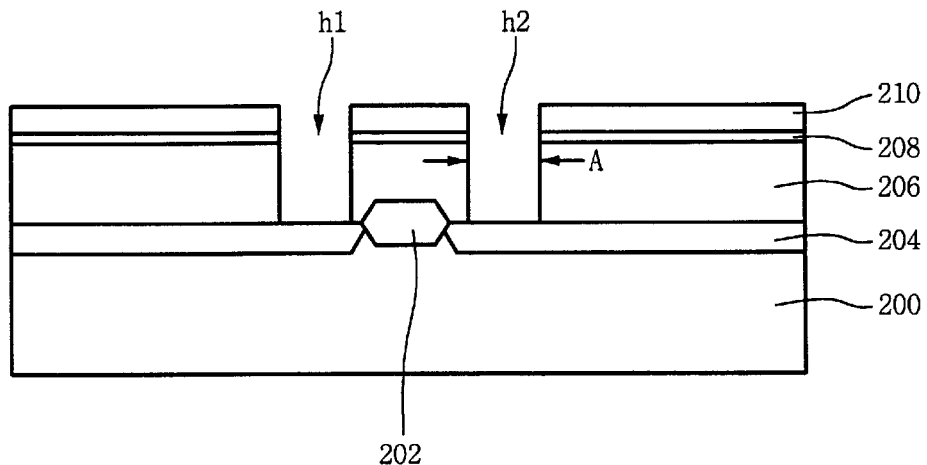
FIGS. 5a to 5c illustrate a method for fabricating a semiconductor device having a multi-level metallization according to a second embodiment of the invention.
Figure 5B:
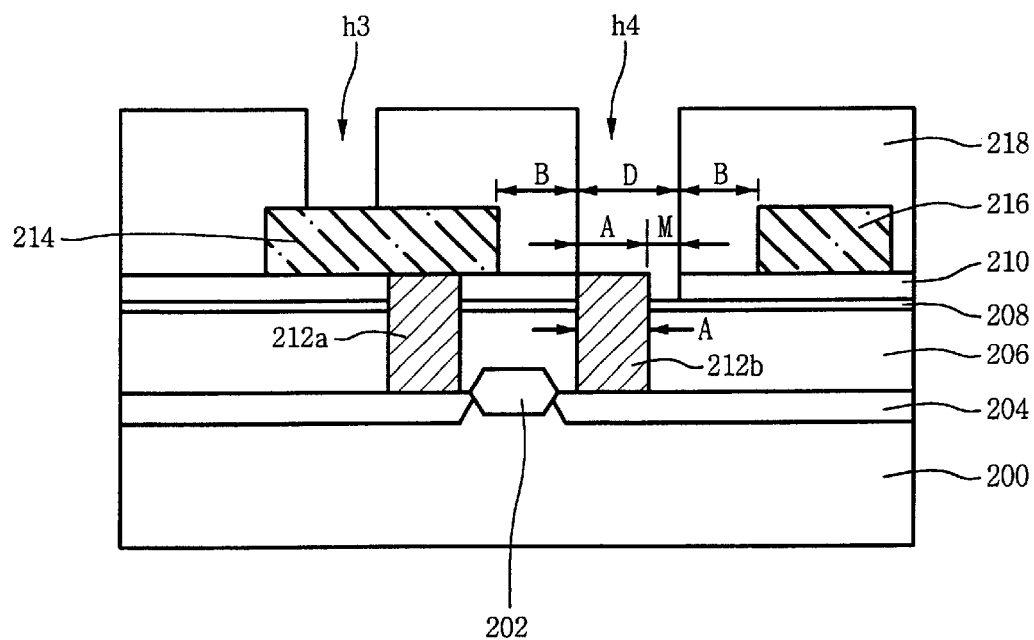
Figure 5C:
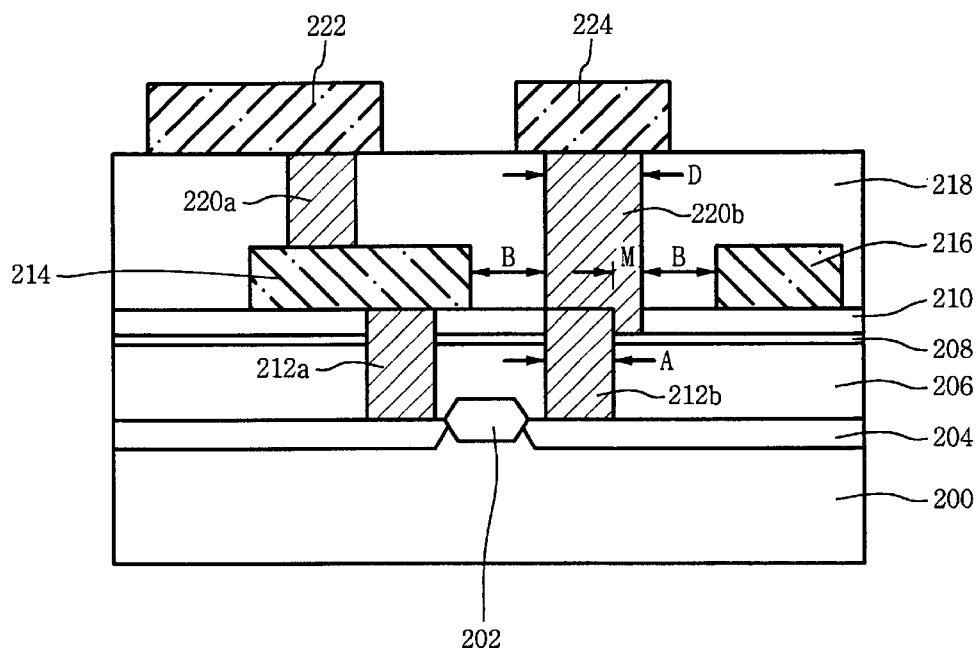

With reference to FIGS. 5a to 5c, a second embodiment of the present invention is described below. With reference to FIG. 5a, a field oxide layer 202 is formed on a semiconductor substrate 200. The field oxide layer 202 defines an active area. Impurities are implanted and diffused into the substrate 200 forming the active area 204. A first insulating layer 206, etching prevention layer 208, and second insulating layer 210 are successively formed on the substrate 200 including the field oxide layer 202. The first insulating layer 206, etching prevention layer 208, and second insulating layer 210 is selectively etched exposing a predetermined portion of the substrate 200 in the active area 204 and forming first and second contact holes h1 and h2, respectively. The second contact hole h2 is formed to have a width denoted by A. The etching prevention layer 208 is made of either a nitride layer or a nitride-oxide layer.

Referring to FIG. 5b, a conductive layer is formed on the second insulating layer 210 including the first and second contact holes h1 and h2. The conductive layer is subjected to a CMP etched-back process until the surface of the second insulating layer 210 is exposed so that first and second conductive plugs 212a and 212b are formed in the first and second contact holes h1 and h2, respectively. A conductive layer is formed on the second insulating layer 210 including the conductive plugs 212a and 212b. The conductive layer is selectively etched exposing the surface of the second conductive plug 212b area predetermined portion of the second insulating layer 210. A first conductive pattern 214 connected to the first conductive plug 212a and the second conductive pattern 216 are formed simultaneously on these exposed portions. At this time, the first and second conductive plugs 212a and 212b are made of polysilicon, polycide, or a multi-level layer composed of a metal barrier layer of Ti/TiN and W (for example, multi-level layer of Ti/TiN/W). The first and second conductive pattern 214 and 216 are made of an Al alloy, Cu alloy, polysilicon, polycide, and a multi-level layer composed of Ti, TiN and Al alloy (for example, multi-level layer of Ti/TiN/Al structure or Al/TiN). The first conductive pattern 214 serves as a medium between the upper and lower plugs and an electrical metallization. The second conductive pattern 216 serves as an electric metallization.

A third insulating layer 218 is formed on the second conductive plug 212b and the second insulating layer 210 including the first and second conductive patterns 214 and 216. The third and second insulating layers 218 and 210 are selectively etched to respectively expose a predetermined portion of the first conductive pattern 214, the surface of the second conductive plug 212b and a predetermined surface of the adjacent etching prevention layer 218, thereby forming third and fourth contact holes h3 and h4, respectively.

The fourth contact hole h4, as shown in FIG. 5b, has a width D in a horizontal direction. The sum of M is the width of the predetermined exposed surface in the etching prevention layer 208. The width A is the width of the second conductive plug 212b as well as of the second contact hole h2. Although not shown in FIG. 5b, the adjacent predetermined surface of the etching prevention layer 208 is exposed along each side of the second conductive plug 212b, such that the fourth contact hole h4 can have an extended width by a predetermined width in a horizontal direction from the width A of the second contact hole h2. Regardless of the width A, the first and second conductive patterns 214 and 216 are spaced at a predetermined distance by the spacer B from the fourth contact hole h4.

The reason for increasing the width of the fourth contact hole h4, the second contact hole h2 is that it increases the contact area between the second and fourth conductive plugs 212b and 216b when the conductive plug is formed in the contact hole h4. Thus, a wider width prevents the contact resistance from increasing even if a misalignment occurs during exposure to light.

With reference to FIG. 5c, using the same method as described for FIG. 5b, third and fourth conductive plugs 220a and 22b, respectively, are formed in the third and fourth contact holes h3 and h4, respectively. A conductive layer is deposited thereon and selectively etched at a predetermined surface forming a third conductive pattern 222 connected to the third conductive plug 220a and a fourth conductive pattern connected to the fourth conductive plug 220b simultaneously.

As before, the third and fourth conductive plugs 220a and 220b are made of polysilicon, polycide, or a multi-level layer composed of a metal barrier layer of Ti/TiN and W material (for example, multi-level layer of Ti/TiN/W). The third and fourth conductive patterns 222 and 224, respectively, are made of an Al alloy, Cu alloy, polysilicon, polycide or multi-level layer composed of Ti, TiN and Al alloy (for example, multi-level layer of Ti/TiN/Al or Al/TiN).

Consequently, as shown in FIG. 5c, the first insulating layer 206, etching prevention layer 208, and the second insulating layer 210 are successively formed on the semiconductor substrate 200 including the active area 204. The first and second contact holes h1 and h2 passing through the second insulating layer 210, etching prevention layer 208, and the first insulating layer 206 are formed such that a predetermined surface of the active area 214 is exposed. In the first and second contact holes h1 and h2, the first and second conductive plugs 212a and 212b are formed. The second conductive plug 212b is laid between the first conductive pattern 214 connected to the first conductive plug 212a and the second conductive pattern 216 spaced a predetermined distance apart from each other. Thereon is formed the third insulating layer 218. In the third insulating layer 218 are formed the third and fourth contact holes h3 and h4, respectively. The third contact hole h3 penetrates the third insulating layer 218 to expose the surface of the first conductive pattern 214. The fourth contact hole h4 penetrates the third insulating layer 218 and the second insulating layer 210 such that the surface of the second conductive plug 212b and the adjacent predetermined surface of the etching prevention layer 208 are exposed. The third and fourth conductive plugs 220a and 220b are formed in the third and fourth contact holes h3 and h4. The third conductive pattern 222 connected to the third conductive plug 220a is spaced a predetermined distance apart from the fourth conductive pattern 224 connected to the fourth conductive plug 220b.

The fourth conductive plug 220b has a width D which is extended by M compared to the width A of the second conductive plug 212b. The width can be also extended by a predetermined distance on both sides of the second conductive plug 212b in a horizontal direction.

Assuming the horizontal width of the fourth conductive plug 220b is D(D=A+M), the width of the second conductive plug 212b is A, a spacer between the first conductive pattern 214, the fourth conductive plug 220b and the second conductive pattern 216 is B, the horizontal distance between the first and second conductive patterns 214 and 216, respectively, is given by D+(2*B).

Figure 6:
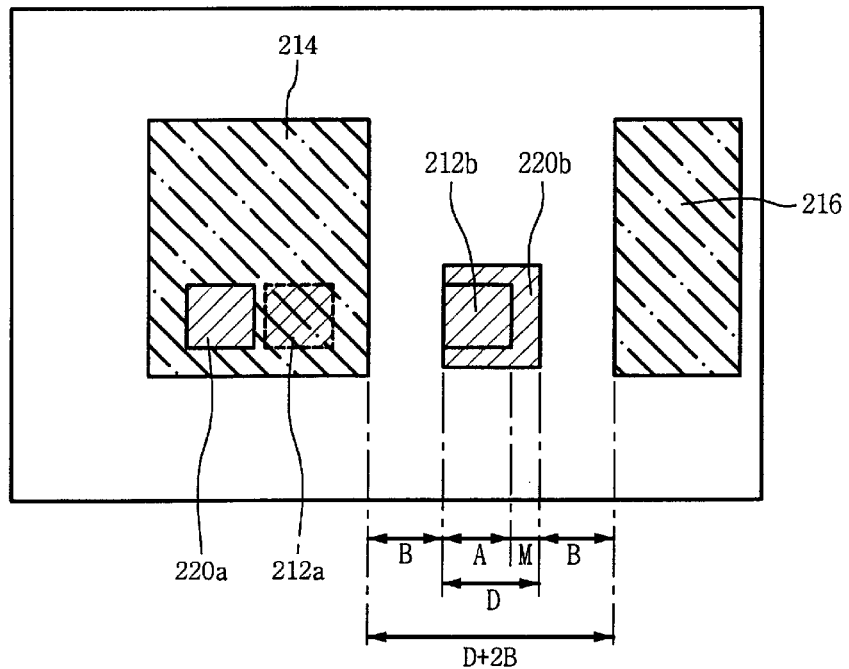
FIG. 6 is a top view showing a layout of of the semiconductor device shown FIG. 5c.

FIG. 6 is a top view showing the layout of the semiconductor device according to a second embodiment of the invention. For convenience, only a layout of the lower part of the third and fourth conductive patterns 222 and 224, are described. With reference to FIG. 6, the second and fourth conductive plugs 108b and 118b are connected directly without a contact pad therebetween. The second and fourth conductive plugs are on the same line between the first and second conductive patterns 110 and 112 and spaced a predetermined distance apart denoted as B. The difference between the semiconductor devices of the first and second embodiments is that the fourth contact hole h4, has a size extended by M against the three sides of the second contact hole h2. Thus, the fourth conductive plug 220b is laid under the second conductive plug 212b by a thickness of the second insulating layer 210.

The semiconductor device manufactured using the present invention has a distance between the fourth contact hole h4 and the first and second conductive patterns 214 and 216 that is kept as B as in the first embodiment. Therefore even though the width D of the fourth contact hole h4 is increased to A+M(=2C), its distance is smaller than the conventional horizontal distance between the first and second conductive patterns of A+(2*C)+(2*E), enabling large-scale integration.

As described above, a semiconductor device with a multi-level metallization is fabricated with a changed layout to make the second and fourth conductive plugs directly connected up and down without a contact pad so that the horizontal pattern size of the semiconductor device is reduced realizing a largely integrated semiconductor device.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A semiconductor device having a multi-level metallization, comprising:

a semiconductor substrate having an active area;

a first insulating layer deposited on the substrate;

first and second contact holes formed penetrating the first insulating layer exposing a predetermined surface of the active area;

first and second conductive plugs respectively formed on the first and second contact holes;

first and second conductive patterns spaced a predetermined distance apart on either side of the second conductive plug, the first conductive pattern being connected to the first conductive plug;

an etching prevention layer and a second insulating layer sequentially formed on the first and second conductive patterns and the first insulating layer;

a third contact hole formed penetrating the second insulating layer and the etching prevention layer exposing a predetermined surface of the first conductive pattern;

a fourth contact hole formed penetrating the second insulating layer and the etching prevention layer exposing the second conductive plug;

third and fourth conductive plugs respectively formed on the third and fourth contact holes, the fourth conductive plug directly contacting the second plug; and third and fourth conductive patterns formed on predetermined surfaces of the second insulating layer, the third and fourth conductive patterns being respectively connected to the third and fourth conductive plugs;

wherein the fourth conductive plug is narrower than the second conductive plug.

2. The semiconductor device of claim 1 wherein the first, second, third, and fourth conductive plugs are made of polysilicon, polycide, or a multi-layer material comprising a Ti/TiN and W.

3. The semiconductor device of claim 1 wherein the first, second, third, and fourth conductive patterns are made of an Al alloy, Cu alloy, polysilicon, polycide, or a multi-layer material comprising Ti, TiN, and an Al alloy.

4. The semiconductor device of claim 3 wherein the multi-layer material is either a Ti/TiN/Al or a Al/TiN material.

5. The semiconductor device of claim 1 wherein the first and second conductive patterns are spaced less than 0.2 μm from the fourth conductive plug.

6. The semiconductor device of claim 1 wherein the fourth conductive plug is formed with a width substantially equal to a width of the second conductive plug.

7. A semiconductor device having a multi-level metallization, comprising:

a semiconductor substrate having an active area;

a first insulating layer deposited on the substrate;

first and second contact holes formed penetrating the first insulating layer exposing a predetermined surface of the active area;

first and second conductive plugs respectively formed on the first and second contact holes;

first and second conductive patterns spaced a predetermined distance apart on either side of the second conductive plug, the first conductive pattern being connected to the first conductive plug;

an etching prevention layer and a second insulating layer sequentially formed on the first and second conductive patterns and the first insulating layer;

a third contact hole formed penetrating the second insulating layer and the etching prevention layer exposing a predetermined surface of the first conductive pattern;

a fourth contact hole formed penetrating the second insulating layer and the etching prevention layer exposing the second conductive plug;

third and fourth conductive plugs respectively formed on the third and fourth contact holes, the fourth conductive plug directly contacting the second plug; and third and fourth conductive patterns formed on predetermined surfaces of the second insulating layer, the third and fourth conductive patterns being respectively connected to the third and fourth conductive plugs;

wherein the fourth conductive plug is wider than the second conductive plug.

8. The semiconductor device of claim 7 wherein the first, second, third, and fourth conductive plugs are made of polysilicon, polycide, or a multi-layer material comprising a Ti/TiN and W.

9. The semiconductor device of claim 7 wherein the first, second, third, and fourth conductive patterns are made of an Al alloy, Cu alloy, polysilicon, polycide, or a multi-layer material comprising Ti, TiN, and an Al alloy.

10. The semiconductor device of claim 9 wherein the multi-layer material is either a Ti/TiN/Al or a Al/TiN material.

11. The semiconductor device of claim 7 wherein the first and second conductive patterns are spaced less than 0.2 μm from the fourth conductive plug.

12. The semiconductor device of claim 7 wherein the etching prevention layer is a nitride layer or a nitride-oxide layer.

13. The semiconductor device of claim 7 wherein the first and second insulating layers are oxide layers.

14. The semiconductor device of claim 1 wherein the etching prevention layer is a nitride layer or a nitride-oxide layer.

15. The semiconductor device of claim 1 wherein the first and second insulating layers are oxide layers.

16. A semiconductor device having a multi-level metallization, comprising:

a semiconductor substrate having an active area;

a first insulating layer, an etching prevention layer, and a second insulating layer sequentially formed on the substrate;

first and second contact holes formed penetrating the second insulating layer, the etching prevention layer, and the first insulating layer exposing a predetermined surface of the active area;

first and second conductive plugs respectively formed in the first and second contact holes;

first and second conductive patterns spaced a predetermined distance apart on either side of the second conductive plug, the first and second conductive patterns being formed on the second insulating layer and the first conductive pattern being connected to the first conductive plug;

a third insulating layer formed on the first and second patterns and the second insulating layer;

a third contact hole formed penetrating the third insulating layer exposing a predetermined surface of the first conductive pattern;

a fourth contact hole formed penetrating the third insulating layer and the second insulating layer exposing the second conductive plug and a predetermined adjacent surface of the etching prevention layer;

third and fourth conductive plugs respectively formed on the third and fourth contact holes; and third and fourth conductive patterns formed on predetermined surfaces of the third insulating layer, the third and fourth conductive patterns being respectively connected to the third and fourth conductive plugs.

17. The semiconductor device of claim 16 wherein the first, second, third, and fourth conductive plugs are made of polysilicon, polycide, or a multi-layer material comprising a Ti/TiN metal barrier layer and a W layer.

18. The semiconductor device of claim 16 wherein the first, second, third, and fourth conductive patterns are made of an Al alloy, Cu alloy, polysilicon, polycide, or a multi-layer material comprising Ti, TiN, and an Al alloy.

19. The semiconductor device of claim 18 wherein the multi-layer material is either a Ti/TiN/Al or a Al/TiN material.

20. The semiconductor device of claim 16 wherein the first and second conductive patterns are spaced less than 0.2 μm from the fourth conductive plug.

21. The semiconductor device of claim 16 wherein the fourth contact hole exposes a predetermined surface of the etching prevention layer on one side of the second conductive plug.

22. The semiconductor device of claim 16 wherein the fourth contact hole exposes a predetermined surface of the etching prevention layer on a side of the second conductive plug.

23. The semiconductor device of claim 16 wherein the etching prevention layer is a nitride layer or a nitride-oxide layer.

24. The semiconductor device of claim 16 wherein that, second, and third insulating layers are oxide layers.

* * * * *

UNITED STATES PATENT AND TRADEMARK OFFICE
CERTIFICATE OF CORRECTION

PATENT NO.    : 6,448,651 B1
DATED         : September 10, 2002
INVENTOR(S)   : Kim It is certified that error appears in the above-identified patent and that said Letters Patent is hereby corrected as shown below:

<u>Title page,</u>
Item [56], References Cited, FOREIGN PATENT DOCUMENTS, should include:
-- 410154800    06-1998        Japan           Kuroda --.

Signed and Sealed this

Twenty-seventh Day of April, 2004

JON W. DUDAS
*Acting Director of the United States Patent and Trademark Office*